United States Patent
Ito et al.

(10) Patent No.: US 10,593,585 B2
(45) Date of Patent: Mar. 17, 2020

(54) ELECTROSTATIC CHUCK DEVICE INCLUDING A HEATING MEMBER

(71) Applicant: SUMITOMO OSAKA CEMENT CO., LTD., Tokyo (JP)

(72) Inventors: Tomomi Ito, Tokyo (JP); Yukio Miura, Tokyo (JP)

(73) Assignee: SUMITOMO OSAKA CEMENT CO., LTD, Tokyo (JP)

( * ) Notice: Subject to any disclaimer, the term of this patent is extended or adjusted under 35 U.S.C. 154(b) by 296 days.

(21) Appl. No.: 15/460,647

(22) Filed: Mar. 16, 2017

(65) Prior Publication Data

US 2017/0278738 A1 Sep. 28, 2017

(30) Foreign Application Priority Data

Mar. 24, 2016 (JP) ................................ 2016-059872

(51) Int. Cl.
*H02N 13/00* (2006.01)
*H01L 21/683* (2006.01)

(52) U.S. Cl.
CPC ......... *H01L 21/6833* (2013.01); *H02N 13/00* (2013.01)

(58) Field of Classification Search
CPC ..... B32B 18/00; B32B 2309/68; B32B 27/08; B32B 27/20; B32B 37/0046; B32B 37/02; B32B 37/12; B32B 37/1207; B32B 37/22; B32B 38/0008; B32B 38/18; C04B 41/009; C04B 41/5045; H01J 2237/002; H01J 2237/334; H01J 37/32009; H01J 37/3244; H01J 37/32477; H01J 37/32495; H01J 37/32697; H01J 37/32715; H01J 37/32724; H01J 37/32779; H01J 37/32917;

(Continued)

(56) References Cited

U.S. PATENT DOCUMENTS 7,044,399 B2 * 5/2006 Goto ................... C23C 16/4581
219/443.1
7,672,111 B2 * 3/2010 Miyaji ................ H01L 21/6831
361/234

(Continued)

FOREIGN PATENT DOCUMENTS

| JP | 2008300491 A | * 12/2008 |
| JP | 2011-159684 A | 8/2011 |
| JP | 20140139989 A | 7/2014 |

OTHER PUBLICATIONS

Office Action, Japanese Patent Office, Application No. 2016-059872, dated Apr. 23, 2019, 3 pages.

*Primary Examiner* — Thienvu V Tran
*Assistant Examiner* — Nicolas Bellido
(74) *Attorney, Agent, or Firm* — Greenblum & Bernstein, P.L.C.

(57) ABSTRACT

An electrostatic chuck device includes: an electrostatic chuck section having one principal surface serving as a placing surface on which a plate-shaped sample is placed, and having a built-in electrostatic attracting internal electrode; a heating member bonded to a surface on the side opposite to the placing surface of the electrostatic chuck section in a pattern having gaps; a sheet material; and a base section having a function of cooling the electrostatic chuck section, in this order, in which each of the gaps of the pattern is filled with an inorganic filler composition which includes an inorganic filler and an adhesive.

7 Claims, 1 Drawing Sheet

(58) Field of Classification Search
CPC ........... H01J 37/3405; H01J 37/3417; H01J 37/3423; H01J 37/3452; H01L 21/02002; H01L 21/02087; H01L 21/02107; H01L 21/02118; H01L 21/02164; H01L 21/0217; H01L 21/022; H01L 21/02587; H01L 21/02639; H01L 21/2636; H01L 21/26513; H01L 21/285; H01L 21/28556; H01L 21/304; H01L 21/3065; H01L 21/31116; H01L 21/4871; H01L 21/67011; H01L 21/67028; H01L 21/67069; H01L 21/67092; H01L 21/67098; H01L 21/67103; H01L 21/67109; H01L 21/67126; H01L 21/67248; H01L 21/683; H01L 21/6831; H01L 21/6833; H01L 21/6836; H01L 21/687; H01L 21/68735; H01L 21/68742; H01L 21/6875; H01L 21/68757; H01L 21/68771; H01L 21/68785; H01L 21/76802; H01L 2224/48227; H01L 23/291; H01L 23/34; H01L 23/3731; H01L 41/187; H01L 41/312; H01L 51/56; H02N 13/00
USPC .............................................. 361/230, 234
See application file for complete search history.

(56) References Cited

U.S. PATENT DOCUMENTS

| | | | | |
|---|---|---|---|---|
| 9,343,346 | B2* | 5/2016 | Kosakai | H01L 21/67103 |
| 9,520,814 | B2* | 12/2016 | Hayashi | H02N 13/00 |
| 9,538,583 | B2* | 1/2017 | Volfovski | H05B 3/26 |
| 2002/0139473 | A1* | 10/2002 | Fujii | H01L 21/6831 |
| | | | | 156/330.9 |
| 2012/0299253 | A1* | 11/2012 | Kosakai | H01L 21/67103 |
| | | | | 279/128 |
| 2013/0026720 | A1* | 1/2013 | Hori | H01L 21/6833 |
| | | | | 279/128 |
| 2014/0202618 | A1 | 7/2014 | Hayashi | |
| 2018/0068883 | A1* | 3/2018 | Ito | H02N 13/00 |

* cited by examiner

ELECTROSTATIC CHUCK DEVICE INCLUDING A HEATING MEMBER

CROSS-REFERENCE TO RELATED APPLICATIONS

This application claims the benefit of Japanese Patent Application No. 2016-059872 filed Mar. 24, 2016, the disclosure of which is herein incorporated by reference in its entirety.

BACKGROUND OF THE INVENTION

Field of the Invention

The present invention relates to an electrostatic chuck device.

Description of Related Art

In a semiconductor manufacturing process, in processing of a wafer, an electrostatic chuck device is used as a device for easily mounting and fixing the wafer on and to a sample stage and maintaining the wafer at a desired temperature.

Finer processing of the wafer is progressing according to higher integration and higher performance of a semiconductor element, and a plasma etching technique which is high in production efficiency and enables fine processing of a large area is frequently used. If the wafer fixed to the electrostatic chuck device is irradiated with plasma, the surface temperature of the wafer rises. Therefore, in order to suppress a rise in the surface temperature, the wafer is cooled from the lower side by circulating a cooling medium such as water in a base section of the electrostatic chuck device. However, at this time, due to variation in heat input to the wafer by plasma in the surface of the wafer, a temperature distribution occurs in the surface of the wafer. For example, a temperature tends to become high at a central part of the wafer and become low at an edge portion of the wafer.

For example, in an electrostatic chuck device that adjusts an in-plane temperature distribution of a wafer using gas such as helium, or an electrostatic chuck device having an adjusted contact area between a wafer and the attracting surface of an electrostatic chuck, it is difficult to perform local temperature control.

Further, in an electrostatic chuck device with a heater function according to the related art, there is a case where cracks are generated in an electrostatic chuck section, a base section, or a heater itself due to rapid rise and fall in temperature of the heater, and thus there is a problem in which durability as an electrostatic chuck device is insufficient.

In order to solve such a problem, in the related art, there is disclosed, for example, an electrostatic chuck device in which in a case of being applied to a treatment apparatus such as a plasma etching apparatus, it is possible to perform local temperature control of a plate-shaped sample such as a silicon wafer associated with plasma application by generating a local temperature distribution in the surface of the plate-shaped sample such as a silicon wafer (refer to, for example, Japanese Laid-open Patent Publication No. 2011-159684).

SUMMARY OF THE INVENTION

In order to further suppress variation in the in-plane temperature of the wafer, it is required to further enhance in-plane temperature uniformity of the electrostatic chuck section to which the wafer is fixed.

The present invention has an object to provide an electrostatic chuck device having excellent in-plane temperature uniformity of an electrostatic chuck section, and a task thereof is to achieve the object.

Specific means for achieving the above task is as follows.

<1> An electrostatic chuck device including: an electrostatic chuck section having one principal surface serving as a placing surface on which a plate-shaped sample is placed, and having a built-in electrostatic attracting internal electrode; a heating member bonded to a surface on the side opposite to the placing surface of the electrostatic chuck section in a pattern having gaps; a sheet material; and a base section having a function of cooling the electrostatic chuck section, in this order, in which each of the gaps of the pattern is filled with an inorganic filler composition which includes an inorganic filler and an adhesive.

<2> The electrostatic chuck device according to the above <1>, in which a thermal conductivity (JIS R 1650-3:2002) of the inorganic filler is in a range of 20 W/(m·K) to 200 W/(m·K).

<3> The electrostatic chuck device according to the above <1> or <2>, in which the inorganic filler includes one or more types which are selected from a group consisting of a metal nitride and a metal oxide.

<4> The electrostatic chuck device according to any one of the above <1> to <3>, in which a content of the inorganic filler in the inorganic filler composition is in a range of 20% by volume to 50% by volume.

<5> The electrostatic chuck device according to any one of the above <1> to <4>, in which the inorganic filler includes one or more types which are selected from a group consisting of an aluminum nitride, an aluminum oxide, and a zinc oxide.

<6> The electrostatic chuck device according to any one of the above <1> to <5>, in which the adhesive includes one or more types which are selected from a group consisting of a polyimide resin adhesive, a silicone resin adhesive, and an epoxy resin adhesive.

<7> The electrostatic chuck device according to any one of the above <1> to <6>, in which a filling rate of the inorganic filler composition with respect to a total volume of the gap of the pattern is in a range of 20% by volume to 100% by volume.

<8> The electrostatic chuck device according to any one of the above <1> to <7>, in which the sheet material contains one or more types which are selected from a group consisting of a silicone-based elastomer and a fluorine-based elastomer.

According to the present invention, an electrostatic chuck device having excellent in-plane temperature uniformity of an electrostatic chuck section is provided.

DETAILED DESCRIPTION OF THE INVENTION

Electrostatic Chuck Device

An electrostatic chuck device according to the present invention includes: an electrostatic chuck section having one principal surface serving as a placing surface on which a plate-shaped sample is placed, and having a built-in electrostatic attracting internal electrode; a heating member bonded to a surface on the side opposite to the placing surface of the electrostatic chuck section in a pattern having gaps; a sheet material; and a base section having a function of cooling the electrostatic chuck section, in this order, in which each of the gaps of the pattern is filled with an inorganic filler composition which includes an inorganic filler and an adhesive.

First, the laminated configuration of the electrostatic chuck section, the heating member, the sheet material, and the base section in the electrostatic chuck device according to the present invention will be described.

Figure 1:
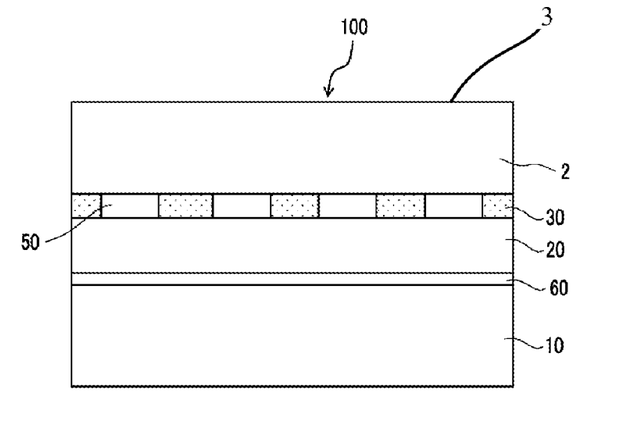
FIG. 1 is a cross-sectional schematic diagram showing an example of a laminated configuration of an electrostatic chuck device according to the present invention.

FIG. 1 is a cross-sectional schematic diagram showing an example of a laminated configuration of the electrostatic chuck device according to the present invention.

An electrostatic chuck device 100 has an electrostatic chuck section 2 having a placing surface 3 adapted receive a wafer, a heating member 50 which heats the electrostatic chuck section 2, and a thick disk-shaped base section 10 having a function of cooling the electrostatic chuck section 2. The heating member 50, a sheet material 20, and an insulating material layer 60 are provided in this order from the electrostatic chuck section 2 side between the electrostatic chuck section 2 and the base section 10, and each of the gaps of the pattern is filled with an inorganic filler composition 30 which includes an inorganic filler and an adhesive.

The heating member 50 is located on the surface (referred to as a heating member installation surface) on the side opposite to the placing surface of the electrostatic chuck section 2 with an adhesive, an adhesive compound, or the like (not shown) interposed therebetween and bonded to the electrostatic chuck section 2 in a pattern having gaps. The heating member 50 can be configured in one or a plurality of patterns in which, for example, a strip-shaped metal material having a narrow width is meandered. In FIG. 1, four heating members 50 are shown. The heating members 50 are usually connected in a single pattern. However, the heating members 50 may be configured with a plurality of patterns of the same type or different types. For example, a plurality of annular heating members having different diameters may be disposed concentrically.

Heat which is generated from the heating member 50 is usually transmitted in an up-and-down direction of the electrostatic chuck device 100 and hardly diffuses in a lateral direction of the electrostatic chuck device 100.

The up-and-down direction of the electrostatic chuck device 100 refers to a direction parallel to a perpendicular line when being drawn from the electrostatic chuck section 2 to the base section 10, and the lateral direction of the electrostatic chuck device 100 refers to a direction orthogonal to the perpendicular line.

In the related art, the gap of the pattern is generally filled with a heat-resistant polymer material such as silicone-based resin or fluorine-based resin, and irregularities which are generated by the electrostatic chuck section 2 and the heating member 50 are buried with the polymer material. However, the polymer material does not have thermal conductivity, and therefore, it is difficult for heat to extensively spread in the gap of the pattern and it is difficult to obtain the in-plane temperature uniformity of the electrostatic chuck section 2.

In contrast, in the present invention, the gap of the pattern is filled with the inorganic filler composition 30 which includes an inorganic filler and an adhesive. The inorganic filler contains a thermally conductive component such as a metal oxide or a metal nitride, and therefore, the heat generated from the heating member 50 is easily conducted through a metal filler filled into the gap of the pattern and the gap of the pattern is also easily heated. Accordingly, the in-plane temperature uniformity of the electrostatic chuck section 2 is excellent.

The inorganic filler composition 30 of the electrostatic chuck device 100 shown in FIG. 1 completely fills up the gap of the pattern, that is, the irregularities generated by the electrostatic chuck section 2 and the heating member 50, and thus the layer thickness of the inorganic filler composition 30 and the height of the heating member 50 are equal to each other. However, the gap of the pattern may not be filled with the inorganic filler composition 30.

Heat conduction in the gap of the pattern is easily achieved by connecting the heating members 50 of the patterns adjacent to each other with the inorganic filler composition 30 which includes the inorganic filler, and therefore, it is acceptable if the gap of the pattern is filled with the inorganic filler composition 30 to the extent that the heating members 50 of the patterns adjacent to each other are connected to each other by the inorganic filler composition 30 which includes an inorganic filler and an adhesive. Specifically, it is acceptable if the filling rate of the inorganic filler composition 30 with respect to the total volume of the gap of the pattern is 20% by volume or more.

It is acceptable if the space between the sheet material 20 and the layer surface of the inorganic filler composition 30, which can be generated in a case where the gap of the pattern is not completely filled with the inorganic filler composition 30, is separately filled with a polymer material or the like.

The sheet material 20 of FIG. 1 is a member for relaxing stress which is caused by the temperature difference between the electrostatic chuck section and the base section, and is preferably made of a soft material. The hardness of the sheet material 20 is not particularly limited. However, for example, if the shore hardness (A) (JIS Z 2246:2000) thereof is in a range of 10 to 70, the space between the sheet material 20 and the layer surface of the inorganic filler composition 30, which can be generated in a case where the gap of the pattern is not completely filled with the inorganic filler composition 30, can be filled with the sheet material 20, and thus the trouble of separately preparing a polymer material or the like can be saved.

The electrostatic chuck device 100 of FIG. 1 has the insulating material layer 60 between the sheet material 20 and the base section 10. In FIG. 1, the insulating material layer 60 is provided at a position adjacent to the base section 10. However, the position of the insulating material layer 60 is not particularly limited, and for example, the insulating material layer 60 may be provided between the heating member 50 and the electrostatic chuck section 2, between the heating member 50 and the sheet material 20, or the like.

The laminated configuration of the electrostatic chuck device according to the present invention is not limited to the configuration shown in FIG. 1.

Hereinafter, description will be made with reference numerals omitted.

Inorganic Filler Composition

The inorganic filler composition includes an inorganic filler and an adhesive.

The inorganic filler composition may further include components other than the inorganic filler and the adhesive, as far as the thermal conductivity in the gap of the pattern of the heating member is not impeded.

Inorganic Filler

From the viewpoint of enhancing the thermal conductivity in the gap of the pattern of the heating member, it is preferable that the inorganic filler is a material having a thermal conductivity (JIS R 1650-3:2002) of 20 W/(m·K) or more. The thermal conductivity is 20 W/(m·K) or more, whereby heating in the gap of the pattern extensively spreads, and thus the in-plane temperature uniformity of the electrostatic chuck section is further improved. The upper limit of the thermal conductivity of the inorganic filler is not particularly limited, and the higher the upper limit, the more preferable. However, usually, it is about 200 W/(m·K) at the most.

It is more preferable that the thermal conductivity of the inorganic filler is 40 W/(m·K) or more. The thermal conductivity of the inorganic filler can be measured by a thermal constant measuring device TC-7000 manufactured by Vacuum Riko Co., Ltd.

As the inorganic filler, a metal nitride, a metal oxide, metal, or the like can be given as an example, and only one type among these materials may be used, or two or more types may be used. However, from the viewpoint of suppressing conduction between the heating members, it is preferable to use one or both of the metal nitride and the metal oxide. It is preferable that the inorganic filler includes one or more types which are selected from the group consisting of a metal nitride and a metal oxide.

As the metal oxide, a zinc oxide [$ZnO_2$; thermal conductivity: 25 W/(m·K)], an aluminum oxide [$Al_2O_3$; thermal conductivity: 40 W/(m·K)], or the like can be given as an example, and as the metal nitride, an aluminum nitride [AlN; thermal conductivity: 170 W/(m·K)], or the like can be given as an example.

It is preferable that the inorganic filler includes one or more types which are selected from the group consisting of an aluminum nitride, an aluminum oxide, and a zinc oxide.

From the viewpoint of enhancing the thermal conductivity in the gap of the pattern of the heating member, it is preferable that the content of the inorganic filler (sometimes referred to as an "inorganic filler concentration") in the inorganic filler composition is in a range of 20% by volume to 50% by volume. The content of the inorganic filler in the inorganic filler composition is 20% by volume or more, whereby the thermal conductivity in the gap of the pattern of the heating member is improved, and the content of the inorganic filler in the inorganic filler composition is 50% by volume or less, whereby it is possible to suppress an embrittlement of the inorganic filler composition.

It is more preferable that the content of the inorganic filler in the inorganic filler composition is in a range of 30% by volume to 50% by volume.

Adhesive

The adhesive acts as a dispersion medium for the inorganic filler and can function as an adhesive between the electrostatic chuck section and the sheet material.

The type of the adhesive is not particularly limited, and a polyimide resin adhesive, a silicone resin adhesive, an epoxy resin adhesive, or the like can be given as an example. Only one type among these adhesives may be used, or two or more types may be used. Among them, an adhesive having heat resistance is preferable from the viewpoint of suppressing deterioration of the inorganic filler composition by heating of the heating member, and the polyimide resin adhesive and the silicone resin adhesive are preferred and the silicone resin adhesive is more preferable.

As described above, the inorganic filler composition may not fill up the entirety of the gap of the pattern. However, from the viewpoint of enhancing the thermal conductivity in the gap of the pattern of the heating member, it is preferable that the filling rate of the inorganic filler composition with respect to the total volume of the gap of the pattern is 20% by volume or more. Form the same viewpoint, it is more preferable that the filling rate of the inorganic filler composition with respect to the total volume of the gap of the pattern is 40% by volume or more, and 60% by volume or more is further preferable, and 80% by volume or more is even further preferable. The upper limit of the filling rate of the inorganic filler composition with respect to the total volume of the gap of the pattern is 100% by volume.

Polymer Material

The space between the sheet material and the layer surface of the inorganic filler composition, which can be generated in a case where the gap of the pattern is not completely filled with the inorganic filler composition, can be separately filled with a polymer material or the like.

As the polymer material, heat-resistant resin such as polyimide resin, a silicone adhesive (silicone rubber), silicone resin, fluorine-based resin, room temperature vulcanizing (RTV) rubber, fluorine silicone rubber, or the like can be given as an example. Only one type among these materials may be used, or two or more types may be used.

Sheet Material

The sheet material is a member for relaxing stress which is caused by the temperature difference between the electrostatic chuck section and the base section, and from such a viewpoint, it is preferable that the sheet material contains one which is selected from the group consisting of a silicone-based elastomer and a fluorine-based elastomer.

The silicone-based elastomer is an elastomer containing organopolysiloxane as its main composition and is classified into a polydimethylsiloxane-based elastomer, a polymethylphenylsiloxane-based elastomer, and a polydiphenylsiloxane-based elastomer. There is also an elastomer partially denatured with a vinyl group, an alkoxy group, or the like. As a specific example, KE series [manufactured by Shin-Etsu Chemical Co., Ltd.], SE series, CY series, and SH series [all manufactured by Dow Corning Toray Silicone Co., Ltd.], or the like can be given.

As the fluorine-based elastomer, an elastomer having a structure in which a hard segment is fluorine-based resin and a soft segment is fluorine-based rubber, an elastomer in which hydrogen atoms of some or all of hydrocarbon groups which are included in a silicone-based elastomer are substituted with fluorine atoms, or the like can be given as an example.

The sheet material may include a silicone-based elastomer or a fluorine-based elastomer independently, may include two or more types, or may include all of one or more types of silicone-based elastomers and one or more types of fluorine-based elastomers.

It is preferable that the thickness of the sheet material is in a range of 20 μm to 500 μm. The thickness of the sheet material is 20 μm or more, whereby it is easy to relax stress which is caused by the temperature difference between the electrostatic chuck section and the base section, and the thickness of the sheet material is 500 μm or less, whereby it is possible to suppress a decrease in the in-plane temperature uniformity of the electrostatic chuck section.

From the viewpoint of relaxing stress which is caused by the temperature difference between the electrostatic chuck section and the base section, it is preferable that the Shore hardness (A) (JIS Z 2246:2000) of the sheet material is in a range of 20 to 80.

Further, by using a sheet material having a Shore hardness (A) (JIS Z 2246:2000) in a range 10 to 70, which is a lower hardness, the space between the sheet material and the layer surface of the inorganic filler composition, which can be generated in a case where the gap of the pattern is not completely filled with the inorganic filler composition, can be buried with the sheet material.

Electrostatic Chuck Section

The electrostatic chuck section has one principal surface serving as a placing surface on which a plate-shaped sample is placed, and has a built-in electrostatic attracting internal electrode.

More specifically, for example, it is preferable that the electrostatic chuck section is configured of a placing plate having an upper surface serving as a placing surface on which a plate-shaped sample such as a semiconductor wafer is placed, a supporting plate which is integrated with the placing plate and supports the placing plate, an electrostatic attracting internal electrode and an insulating material layer (an in-chuck insulating material layer) for insulating the surroundings of the electrostatic attracting internal electrode, which are provided between the placing plate and the supporting plate, and a power-feeding terminal which is provided so as to penetrate the supporting plate and applies a direct-current voltage to the electrostatic attracting internal electrode.

The placing plate and the supporting plate have disk shapes in which the shapes of the superimposed surfaces are the same, and it is preferable that each of the placing plate and the supporting plate is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A configuration is preferable in which a plurality of protrusion portions each having a diameter smaller than the thickness of the plate-shaped sample are formed on the placing surface of the placing plate and support the plate-shaped sample.

It is preferable that the thickness (the total thickness of the placing plate and the supporting plate) of the electrostatic chuck section is in a range of 0.7 mm to 5.0 mm. The thickness of the electrostatic chuck section is 0.7 mm or more, whereby it is possible to secure the mechanical strength of the electrostatic chuck section. The thickness of the electrostatic chuck section is 5.0 mm or less, whereby heat transfer in the lateral direction of the electrostatic chuck section is hard to increase and a predetermined in-plane temperature distribution is easily obtained, and therefore, heat capacity is hard to increase and a thermal responsiveness is hardly degraded.

The electrostatic attracting internal electrode is used as an electrostatic chuck electrode for generating electric charges and fixing the plate-shaped sample with an electrostatic attracting force, and the shape or size thereof is appropriately adjusted according to a use thereof.

The electrostatic attracting internal electrode is formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or high melting point metal such as tungsten (W), tantalum (Ta), or molybdenum (Mo).

The thickness of the electrostatic attracting internal electrode is not particularly limited. However, the thickness is preferably in a range of 0.1 μm to 100 μm and more preferably in a range of 5 μm to 20 μm. The thickness of the electrostatic attracting internal electrode is 0.1 μm or more, whereby it is possible to secure sufficient electrical conductivity, and the thickness is 100 μm or less, whereby it is difficult for the difference in coefficient of thermal expansion between the placing plate and the supporting plate and the electrostatic attracting internal electrode to become large, and it is difficult for cracks to occur in the joint interface between the placing plate and the supporting plate.

The electrostatic attracting internal electrode having such a thickness can be easily formed by a film formation method such as a sputtering method or a vapor deposition method, or a coating method such as a screen printing method.

The in-chuck insulating material layer surrounds the electrostatic attracting internal electrode so as to protect the electrostatic attracting internal electrode from corrosive gas and plasma thereof, and joins and integrates a boundary portion between the placing plate and the supporting plate, that is, outer peripheral portion regions other than the electrostatic attracting internal electrode. It is preferable that the in-chuck insulating material layer is configured of an insulating material having the same composition or the same main component as the materials configuring the placing plate and the supporting plate.

The power-feeding terminal is a rod-shaped member provided in order to apply a direct-current voltage to the electrostatic attracting internal electrode. A material of the power-feeding terminal is not particularly limited as long as it is a conductive material having excellent heat resistance. However, a material having a coefficient of thermal expansion approximated to the coefficients thermal expansion of the electrostatic attracting internal electrode and the supporting plate is preferable, and for example, conductive ceramic configuring the electrostatic attracting internal electrode or a metal material such as tungsten (W), tantalum (Ta), molybdenum (Mo), niobium (Nb), or a kovar alloy is suitably used.

It is preferable that the power-feeding terminal is insulated from the base section by an insulator having insulation properties.

Further, it is preferable that the power-feeding terminal is joined to and integrated with the supporting plate and the placing plate and the supporting plate are joined to and integrated with each other by the electrostatic attracting internal electrode and the in-chuck insulating material layer, thereby configuring the electrostatic chuck section.

Heating Member

The heating member is located on the surface on the side opposite to the placing surface of the electrostatic chuck section and is bonded to the electrostatic chuck section in a pattern having gaps, with an adhesive, an adhesive compound, or the like interposed therebetween.

The shape of the heating member is not particularly limited. However, it is preferable that the heating member is a heater element composed of two or more heater patterns independent of each other.

The heater element can be configured of, for example, two heaters independent of each other; an inner heater formed at a center portion of the surface (a heating member installation surface) on the side opposite to the placing surface of the electrostatic chuck section, and an outer heater annularly formed outside a peripheral edge portion of the inner heater. Each of the inner heater and the outer heater can have a single continuous strip-shaped heater pattern formed by repeatedly disposing a meandering pattern of a narrow strip-shaped metal material about the center axis of the heating member installation surface and connecting the patterns adjacent to each other.

By independently controlling each of the inner heater and the outer heater, it is possible to accurately control the in-plane temperature distribution of the plate-shaped sample fixed to the placing surface of the placing plate of the electrostatic chuck section by electrostatic attraction.

It is preferable that the heater element is formed by etching a nonmagnetic metal thin plate, for example, a titanium (Ti) thin plate, a tungsten (W) thin plate, a molybdenum (Mo) thin plate, or the like, having a constant thickness of 0.2 mm or less, preferably, 0.1 mm or less, in a desired heater pattern by a photolithography method.

The thickness of the heater element is 0.2 mm or less, whereby it is difficult for the pattern shape of the heater element to be reflected as the temperature distribution of the plate-shaped sample and it becomes easy to maintain the in-plane temperature of the plate-shaped sample at a desired temperature pattern.

Further, if the heater element is formed of nonmagnetic metal, even if the electrostatic chuck device is used in a high frequency atmosphere, it is difficult for the heater element to cause self-heating due to a high frequency and it becomes easy to maintain the in-plane temperature of the plate-shaped sample at a desired constant temperature or a constant temperature pattern.

Further, if the heater element is formed by using a nonmagnetic metal thin plate having a constant thickness, the thickness of the heater element becomes constant over the entire heating surface and the amount of heat generation also becomes constant over the entire heating surface. Therefore, it is possible to uniformize a temperature distribution in the placing surface of the electrostatic chuck section.

Insulating Material Layer

It is preferable that the electrostatic chuck device has an insulating material layer covering at least a part of the base section.

The electrostatic chuck device according to the present invention has the heating member for heating the electrostatic chuck section, and therefore, it is preferable to have an insulating material layer in order to suppress the conduction (short-circuit defect) between the electrostatic chuck section and the base section and improve the withstand voltage property of the base section.

It is acceptable if the insulating material layer covers at least a part of the base section. However, it is preferable that the insulating material layer is a film-shaped or sheet-shaped layer covering the entirety of the base section.

Further, it is acceptable if the position of the insulating material layer is located between the electrostatic chuck section and the base section, and the insulating material layer may be configured in not only a single layer but also a plurality of layers. For example, the insulating material layer may be provided at a position adjacent to the base section, between the heating member and the electrostatic chuck section, between the heating member and the sheet material, or the like.

Among the above, from the viewpoint of easiness of formation of the insulating material layer, it is preferable that the insulating material layer is provided at a position adjacent to the base section between the heating member and the base section.

In a case of fixing the insulating material layer to the base section, it is preferable that the insulating material layer is fixed to the upper surface of the base section through an adhesive. An adhesive (an adhesive for the insulating material layer) which is used for fixing of the insulating material layer is not particularly limited, and sheet-shaped or film-shaped adhesive resin having heat resistance and insulation properties, such as polyimide resin, silicone resin, or epoxy resin, can be used. The thickness of the adhesive for the insulating material layer is preferably in a range of 5 µm to 100 µm, and more preferably in a range of 10 µm to 50 µm. From the viewpoint of enhancing the in-plane uniformity of the temperature control of the electrostatic chuck section by the base section, it is preferable that variation in the in-plane thickness of the adhesive for the insulating material layer is within 10 µm.

From the viewpoint of temperature adjustment of the electrostatic chuck section, the thermal conductivity of the insulating material layer is preferably in a range of 0.05 W/mk or more and 0.5 W/mk or less, and more preferably, in a range of 0.1 W/mk or more and 0.25 W/mk or less.

Base Section

The base section is a member having a function of cooling the electrostatic chuck section and adjusting the electrostatic chuck section heated by the heating member to a desired temperature, and also has a function of lowering heat generation caused by etching or the like of the plate-shaped sample fixed to the electrostatic chuck section.

The shape of the base section is not particularly limited. However, it is usually a thick disc shape. It is preferable that the base section is a water-cooled base or the like, in which a flow path for circulating water is formed inside thereof.

As a material configuring the base section, metal which is excellent in thermal conductivity, electric conductivity, and workability, a compound material which includes the metal, or ceramic can be given as an example. Specifically, for example, aluminum (Al), an aluminum alloy, copper (Cu), a copper alloy, stainless steel (SUS), or the like is suitably used. It is preferable that at least the surface which is exposed to plasma, of the base section, is subjected to alumite treatment or has an insulating film such as alumina formed thereon.

Method of Manufacturing Electrostatic Chuck Device

A method of manufacturing the electrostatic chuck device is not particularly limited as long as it is a method capable of forming the laminated configuration of the electrostatic chuck device according to the present invention, and the electrostatic chuck section, the heating member with the inorganic filler composition, the sheet material, and the base section are laminated in this order, and the electrostatic chuck section and the base section may be then pressed by a hot calender or the like so as to sandwich the heating member with the inorganic filler composition and the sheet material therebetween, or layers adjacent to each other may be bonded to each other by interposing an adhesive between the respective layers. In a case of using the adhesive, an adhesive sheet may be used or a liquid adhesive may be used. However, from the viewpoint of reducing the layer thickness of an adhesion layer, it is preferable to use a coating liquid (hereinafter referred to as adhesion solution) which includes an adhesive, water, and, if necessary, an organic solvent that dissolves the adhesive.

In the manufacturing of the electrostatic chuck device, it is preferable that the heating member is fixed onto the heating member installation surface of the electrostatic chuck section in advance by an adhesive or the like. In a case where the electrostatic chuck device is provided with the insulating material layer, it is preferable that the insulating material layer is fixed onto the base section by an adhesive (an adhesive for the insulating material layer).

With respect to the heating member, one or a plurality of individual heating members may be fixed onto the heating member installation surface at intervals. Alternatively, after a film-shaped or plate-shaped heating member is stuck to the heating member installation surface, a part of the heating member may be removed by etching or the like so as to expose the heating member installation surface and form a gap.

Each of the gaps of the pattern is filled with the inorganic filler composition which includes an inorganic filler and an adhesive. As the inorganic filler composition, it is preferable to use an inorganic filler dispersion liquid which includes an adhesive and a solvent dissolving the adhesive such that the content of the inorganic filler in the inorganic filler composition is, for example, in a range of 20% by volume to 50% by volume.

As the solvent dissolving the adhesive, although it depends on the type of the adhesive, methyl ethyl ketone, methyl isobutyl ketone, cyclohexanone, or the like can be given as an example.

As a method of applying the inorganic filler dispersion liquid to the gaps of the pattern, application by screen printing, application by spin coating, application by spraying, a brush, or a bar coater, discharging by an inkjet method, or the like can be given as an example.

After the application of the inorganic filler dispersion liquid, it is preferable to remove the solvent by heating the dispersion liquid-applied surface. It is preferable that the heating of the dispersion liquid-applied surface is performed under the conditions of a temperature in a range of 80° C. to 120° C. and a time in a range of 30 second to 5 minutes, although it varies depending on the film thickness of an inorganic filler dispersion liquid film, the concentration or the type of the adhesive or the inorganic filler in the inorganic filler dispersion liquid, or the like.

In a case where the entirety of the gap of the pattern is not filled with the inorganic filler composition and the gap of the pattern is filled with the inorganic filler composition at a ratio in which the filling rate of the inorganic filler composition with respect to the total volume of the gap of the pattern becomes less than 100% by volume, a polymer material can be further applied to the gap of the pattern.

It is preferable that the polymer material is applied to the gap of the pattern by using a polymer material solution which includes a polymer material and a solvent dissolving the polymer material. As the solvent dissolving the polymer material, although it depends on the type of the polymer material, methyl ethyl ketone, methyl isobutyl ketone, cyclohexanone, or the like can be given as an example, and for example, in a case where polyimide resin is used as the polymer material, it is preferable to use methyl ethyl ketone as the solvent. A method of applying the polymer material solution to the gap of the pattern is the same as the method of applying the inorganic filler dispersion liquid. Removing the solvent by heating the polymer material solution-applied surface after application of the polymer material solution and the temperature at that time are also the same as in the method of applying the inorganic filler dispersion liquid.

It is preferable that the adhesion solution is applied to one side or both sides of the sheet material in advance. The sheet material with the adhesion solution applied thereto is sandwiched between the electrostatic chuck section with the heating member and the base section and pressed by a hot calender or the like, whereby the electrostatic chuck device is obtained.

If a sheet material having a Shore hardness (A) in a range of 10 to 70 is used, in a case where the filling rate of the inorganic filler composition with respect to the total volume of the gap of the pattern is less than 100% by volume, the gap of the pattern can be filled with the sheet material.

When the insulating material layer is provided in the electrostatic chuck device, the adhesion solution is applied to one side or both sides of an insulating material, and the sheet material with the adhesion solution applied thereto and the insulation material with the adhesion solution applied thereto are disposed at arbitrary positions and sandwiched between the electrostatic chuck section with the heating member and the base section, and pressed by a hot calender or the like, whereby the electrostatic chuck device with the insulating material layer is obtained.

As the adhesive of the adhesion solution, known adhesives can be used and various adhesives such as an acrylic adhesive, an epoxy adhesive, and silicone-based adhesive can be used. The adhesive may be a commercially available product, and for example, as a silicone adhesive (including a silicone adhesive compound), a silicone adhesive compound (for example, SD 4580 PSA, SD 4584 PSA, SD 4585 PSA, SD 4587 L PSA, SD 4560 PSA, or the like) manufactured by Dow Corning Toray Co., Ltd., a silicone adhesive (for example, XE13-B3208, TSE3221, TSE3212S, TSE3261-G, TSE3280-G, TSE3281-G, TSE3221, TSE326, TSE326M, TSE325, or the like) manufactured by Momentive Performance Materials Inc., a silicone adhesive (for example, KE-1820, KE-1823, KE-1825, KE-1830, KE-1833, or the like) manufactured by Shin-Etsu Chemical Co., Ltd., or the like can be given as an example.

The adhesion solution may include an organic solvent that dissolves the adhesive. As the organic solvent, there is no particular limitation as long as it is an organic solvent capable of dissolving the adhesive, and at least one type which is selected from the group consisting of alcohol and ketone can be given as an example. As the alcohol, methanol, ethanol, isopropyl alcohol, or the like can be given as an example, and as the ketone, acetone, methyl ethyl ketone, or the like can be given as an example.

From the viewpoint of uniform coating in a thin film, it is preferable that the adhesion solution is prepared in a range where the concentration of the adhesive is in a range of 0.05% by mass to 5% by mass. It is preferable that the concentration of the adhesive in the adhesion solution is in a range of 0.1% by mass to 1% by mass.

Further, the adhesion solution may include a catalyst in order to promote the hydrolysis of the adhesive. As the catalyst, a hydrochloric acid, a nitric acid, ammonia, or the like can be given as an example, and among them, the hydrochloric acid and the ammonia are preferable.

From the viewpoint of suppressing the catalyst remaining in the electrostatic chuck device, it is preferable that the adhesion solution does not include the catalyst, and it is preferable that the adhesion solution includes an adhesive in which a reactive functional group is an epoxy group, an isocyanate group, an amino group, or a mercapto group, as the adhesive.

Further, it is preferable that the electrostatic chuck section is manufactured as follows.

First, the plate-shaped placing plate and the plate-shaped supporting plate are fabricated by using an aluminum oxide-silicon carbide ($Al_2O_3$—SiC) compound sintered compact. In this case, each of the placing plate and the supporting plate can be obtained by forming mixed powder which includes silicon carbide powder and aluminum oxide powder into a desired shape and thereafter, performing calcination for a predetermined time at a temperature, for example, in a range of 1600° C. to 2000° C. and under a non-oxidative atmosphere, preferably, an inert atmosphere.

Subsequently, a plurality of fixing holes for fitting and holding the power-feeding terminals therein are formed in the supporting plate. The power-feeding terminal is fabricated so as to have a size and a shape in which the terminal can be fixed in close contact with the fixing hole of the supporting plate. As a method of fabricating the power-feeding terminal, for example, in a case where the power-feeding terminal is made of a conductive compound sintered compact, a method in which conductive ceramic powder is formed into a desired shape and pressed and calcinated, or the like can be given as an example.

At this time, as the conductive ceramic powder which is used for the power-feeding terminal, conductive ceramic powder made of the same material as the electrostatic attracting internal electrode is preferable.

Further, in a case where the power-feeding terminal is made of metal, high melting point metal is used, and a method of forming it by a metal working method such as a grinding method or a powder metallurgy, or the like can be given as an example.

Subsequently, a coating liquid for formation of the electrostatic attracting internal electrode, in which a conductive material such as the conductive ceramic powder is dispersed in an organic solvent which includes terpineol, ethyl cellulose, and the like, is coated to a predetermined area of the surface of the supporting plate with the power-feeding terminals fitted therein, so as to comes into contact with the power-feeding terminals, and dried, thereby forming an electrostatic attracting internal electrode forming layer.

As the coating method, it is desirable to use a screen printing method or the like, because it is necessary to coat the coating liquid in a uniform thickness. Further, as other methods, there are a method of forming a thin film of the high meting point metal by a vapor deposition method or a sputtering method, a method of forming an electrostatic attracting internal electrode forming layer by disposing a thin plate made of the conductive ceramic or high meting point metal, and the like.

Further, an in-chuck insulating material layer which includes a powder material having the same composition or the same main component as the placing plate and the supporting plate is formed at an area except for the area in which the electrostatic attracting internal electrode forming layer is formed, on the supporting plate, in order to improve insulation properties, corrosion resistance, and plasma resistance. The in-chuck insulating material layer can be formed, for example, by coating a coating liquid, in which insulating material powder having the same composition or the same main component as the placing plate and the supporting plate is dispersed in an organic solvent which includes terpineol, ethyl cellulose, and the like, to the predetermined area by screen printing or the like, and drying it.

Subsequently, the placing plate is superimposed on the electrostatic attracting internal electrode forming layer and the insulating material on the supporting plate, and subsequently, these are integrated together by hot calender work under a high temperature and high pressure. It is preferable that an atmosphere in this hot calender work is vacuum or an inert atmosphere such as Ar, He, $N_2$, or the like. Further, the pressure is preferably in a range of 5 to 10 MPa, and the temperature is preferably in a range of 1600° C. to 1850° C.

The electrostatic attracting internal electrode forming layer is calcinated by the hot calender, whereby the electrostatic attracting internal electrode made of a conductive compound sintered compact is obtained. At the same time, the supporting plate and the placing plate are joined to and integrated with each other with the in-chuck insulating material layer interposed therebetween.

Further, the power-feeding terminals are re-calcinated by a hot calender under a high temperature and high pressure and fixed in close contact with the fixing holes of the supporting plate.

Then, the electrostatic chuck section is obtained by machining the upper and lower surfaces, the outer periphery, a gas hole, and the like of the joined body.

EXAMPLE

Hereinafter, the present invention will be described using examples. However, the present invention is not limited to these examples.

In the following examples and comparative example, laminated bodies each having a laminated configuration similar to the laminated configuration of the electrostatic chuck device shown in FIG. 1 were fabricated and evaluated.

1. Configurations of Laminated Bodies of Examples and Comparative Example

Each of the laminated bodies of the examples and the comparative example has a configuration in which the electrostatic chuck section 2, the heating member 50 with the inorganic filler composition 30, the sheet material 20, and the base section 10 in FIG. 1 are laminated in this order. However, the laminated body of Comparative Example 1 is not provided with the inorganic filler composition 30 in FIG. 1 and the gaps of the pattern of the heating member 50 are filled with the sheet material 20.

2. Manufacturing of Laminated Body

After Ti foil (the heating member 50) has been fixed onto a ceramic plate ($Al_2O_3$—SiC compound sintered compact; the electrostatic chuck section 2) by a silicone resin adhesive, the Ti foil is etched, whereby a part of the ceramic plate was exposed and a Ti pattern in which ring-shaped Ti foils having different diameters were concentrically disposed was formed.

An inorganic filler dispersion liquid which includes the inorganic filler and the adhesive shown in Table 1 and has the inorganic filler concentration shown in Table 1 was coated onto the ceramic plate on which a concave-convex surface due to the Ti pattern was formed, and dried. At this time, the inorganic filler dispersion liquid was coated such that the filling rate of the pattern gap with a coating film (the inorganic filler composition) after drying of the inorganic filler dispersion liquid reached the filling rate shown in Table 1. Thereafter, a sheet material made of a silicone-based elastomer having a Shore hardness (A) of 50 was laminated on the Ti pattern and the coated surface of the inorganic filler dispersion liquid, an aluminum jig (diameter: 40 mm, thickness: 2 cm, the base section 10) was further laminated thereon, and the ceramic plate and the aluminum jig were bonded together and heated (subjected to heat calender work) at 100° C. for 3 minutes, whereby a laminated body was obtained.

In Comparative Example 1, the inorganic filler dispersion liquid is not applied, and the sheet material was directly laminated on the ceramic plate on which a concave-convex surface due to the Ti pattern was formed.

Further, in the laminated body in which the filling rate of the inorganic filler composition is less than 100% by volume, the space generated between the surface of the inorganic filler composition and the sheet material was buried with the sheet material due to a heat calender when manufacturing the laminated body.

3. Evaluation Method

With respect to test pieces and the laminated bodies of the examples and the comparative example, an in-plane temperature uniformity evaluation by a shape change evaluation of the laminated body was performed. Specifically, the evaluation was performed as follows.

The total layer thicknesses at five places of each of the laminated bodies of the examples and the comparative example were measured by using film thickness VL-50A manufactured by Mitutoyo Corporation. Among the obtained measurement results, the difference between the layer thickness of the place having the largest layer thickness and the layer thickness of the place having the smallest layer thickness was set to be a film thickness fluctuation and evaluated according to the following criteria.

The film thickness fluctuation serves as an index of the shape change evaluation of the test piece and serves as an index of the in-plane temperature uniformity of a wafer which is fixed to the electrostatic chuck device, and in a case where the film thickness fluctuation is less than 10 μm, the in-plane temperature uniformity of the electrostatic chuck section is excellent.

Evaluation Criteria

A: The film thickness fluctuation was less than 3 μm.

B: The film thickness fluctuation was 3 μm or more and less than 10 μm.

C: There was a film thickness fluctuation of 10 μm or more.

TABLE 1

| | Laminated body Inorganic filler composition | | | | | |
|---|---|---|---|---|---|---|
| | | Inorganic filler | | | Filling rate (% by volume) | Evaluation In-plane temperature uniformity |
| | With or without | Type | Thermal conductivity (W/(m · K)) | Concentration (% by volume) | Adhesive Type | | |
| Example 1 | With | AlN | 170 | 25 | Silicone resin adhesive | 100 | A |
| Example 2 | With | Al$_2$O$_3$ | 40 | 25 | Silicone resin adhesive | 100 | B |
| Example 3 | With | AlN | 170 | 50 | Silicone resin adhesive | 100 | A |
| Example 4 | With | AlN | 170 | 25 | Silicone resin adhesive | 20 | B |
| Example 5 | With | AlN | 170 | 25 | Silicone resin adhesive | 50 | A |
| Comparative Example 1 | Without | — | — | — | — | — | C |

As can be seen from Table 1, the gaps of the pattern of the heating member were filled with the inorganic filler composition which includes an inorganic filler, whereby heating in the lateral direction between the heating members progressed, and thus the in-plane temperature uniformity of the electrostatic chuck section was excellent.

What is claimed is:

1. An electrostatic chuck device comprising:
   an electrostatic chuck section having one principal surface serving as a placing surface adapted to receive a plate-shaped sample, and having a built-in electrostatic attracting internal electrode;
   a heating member bonded to a surface on an opposite side of the placing surface of the electrostatic chuck section in a pattern having gaps;
   at a lower section of the heating member, a sheet material; and
   at a lower section of the sheet material, a base section having a function of cooling the electrostatic chuck section,
   wherein each of the gaps of the pattern is filled with an inorganic filler composition which includes an inorganic filler and an adhesive;
   wherein a filling rate of the inorganic filler composition with respect to a total volume of the gap of the pattern is in a range of 50% by volume to 100% by volume, a layer thickness of the inorganic filler composition being no greater than a thickness of the heating member; and
   wherein the inorganic filler composition is bonded to the electrostatic chuck section.

2. The electrostatic chuck device according to claim 1, wherein a thermal conductivity (JIS R 1650-3:2002) of the inorganic filler is in a range of 20 W/(m·K) to 200 W/(m·K).

3. The electrostatic chuck device according to claim 1, wherein the inorganic filler includes one or more types which are selected from a group consisting of a metal nitride and a metal oxide.

4. The electrostatic chuck device according to claim 1, wherein a content of the inorganic filler in the inorganic filler composition is in a range of 20% by volume to 50% by volume.

5. The electrostatic chuck device according to claim 1, wherein the inorganic filler includes one or more types which are selected from a group consisting of an aluminum nitride, an aluminum oxide, and a zinc oxide.

6. The electrostatic chuck device according to claim 1, wherein the adhesive includes one or more types which are selected from a group consisting of a polyimide resin adhesive, a silicone resin adhesive, and an epoxy resin adhesive.

7. The electrostatic chuck device according to claim 1, wherein the sheet material contains one or more types which are selected from a group consisting of a silicone-based elastomer and a fluorine-based elastomer.

* * * * *